United States Patent
Zang et al.

(10) Patent No.: US 10,937,786 B2
(45) Date of Patent: Mar. 2, 2021

(54) GATE CUT STRUCTURES

(71) Applicant: GLOBALFOUNDRIES INC., Grand Cayman (KY)

(72) Inventors: Hui Zang, Guilderland, NY (US); Ruilong Xie, Niskayuna, NY (US); Laertis Economikos, Wappingers Falls, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 52 days.

(21) Appl. No.: 16/134,173

(22) Filed: Sep. 18, 2018

(65) Prior Publication Data

US 2020/0091143 A1 Mar. 19, 2020

(51) Int. Cl.
| | |
|---|---|
| *H01L 21/00* | (2006.01) |
| *H01L 27/088* | (2006.01) |
| *H01L 29/08* | (2006.01) |
| *H01L 29/78* | (2006.01) |
| *H01L 29/66* | (2006.01) |
| *H01L 21/8234* | (2006.01) |

(52) U.S. Cl.
CPC .... *H01L 27/0886* (2013.01); *H01L 21/82345* (2013.01); *H01L 21/823468* (2013.01); *H01L 21/823475* (2013.01); *H01L 29/0847* (2013.01); *H01L 29/6656* (2013.01); *H01L 29/66545* (2013.01); *H01L 29/7851* (2013.01); *H01L 2029/7858* (2013.01)

(58) Field of Classification Search
CPC ......... H01L 27/0886; H01L 21/823468; H01L 29/0847
See application file for complete search history.

(56) References Cited

U.S. PATENT DOCUMENTS

| | | | | |
|---|---|---|---|---|
| 7,006,378 B1* | 2/2006 | Saito | ............... | G11C 16/0475 |
| | | | | 257/315 |
| 9,406,676 B2 | 8/2016 | Yu et al. | | |
| 9,853,028 B1* | 12/2017 | Cheng | ............... | H01L 29/7827 |
| 10,008,417 B1* | 6/2018 | Bao | ............... | H01L 27/088 |
| 10,084,053 B1* | 9/2018 | Xie | ............... | H01L 21/28176 |
| 10,090,402 B1* | 10/2018 | Park | ............... | H01L 29/6656 |
| 10,243,060 B2* | 3/2019 | Chao | ............... | H01L 21/3065 |
| 10,332,962 B2* | 6/2019 | Miao | ............... | H01L 29/66469 |
| 10,403,738 B1* | 9/2019 | Sung | ............... | H01L 29/66553 |
| 10,418,368 B1* | 9/2019 | Bentley | ............... | H01L 21/743 |
| 10,446,664 B1* | 10/2019 | Cheng | ............... | H01L 29/66439 |
| 10,553,679 B2* | 2/2020 | Zhang | ............... | H01L 29/41725 |
| 10,615,258 B2* | 4/2020 | Miao | ............... | H01L 29/42392 |
| 10,756,175 B2* | 8/2020 | Lee | ............... | H01L 29/1033 |
| 2002/0197810 A1* | 12/2002 | Hanafi | ............... | H01L 29/66772 |
| | | | | 438/330 |
| 2005/0026380 A1* | 2/2005 | Kammler | ............... | H01L 29/6656 |
| | | | | 438/305 |

(Continued)

*Primary Examiner* — Laura M Menz

(74) *Attorney, Agent, or Firm* — Francois Pagette; Andrew M. Calderon; Roberts Calderon Safran & Cole, P.C.

(57) ABSTRACT

The present disclosure generally relates to semiconductor structures and, more particularly, to gate cut structures and methods of manufacture. The structure includes: a plurality of gate structures comprising source and drain regions and sidewall spacers comprised of different dielectric materials; and contacts connecting to the source and drain regions and isolated from the gate structures by the different dielectric materials.

20 Claims, 12 Drawing Sheets

(56) References Cited

U.S. PATENT DOCUMENTS

| | | | |
|---|---|---|---|
| 2007/0257303 A1* | 11/2007 | Liu | H01L 29/6659 |
| | | | 257/315 |
| 2010/0117163 A1* | 5/2010 | Miyashita | H01L 21/3105 |
| | | | 257/408 |
| 2012/0126309 A1* | 5/2012 | Yater | H01L 27/11573 |
| | | | 257/326 |
| 2018/0069000 A1* | 3/2018 | Bergendahl | H01L 21/823468 |
| 2018/0277430 A1* | 9/2018 | Xie | H01L 21/764 |
| 2018/0277656 A1* | 9/2018 | Chao | H01L 21/02247 |
| 2019/0109191 A1* | 4/2019 | Miao | H01L 29/0673 |
| 2019/0181224 A1* | 6/2019 | Zhang | H01L 29/78621 |
| 2019/0189625 A1* | 6/2019 | Cheng | H01L 29/66742 |
| 2019/0189741 A1* | 6/2019 | Miao | H01L 29/775 |
| 2019/0296127 A1* | 9/2019 | Cheng | B82Y 10/00 |
| 2019/0393306 A1* | 12/2019 | Zhang | H01L 21/28518 |
| 2019/0393345 A1* | 12/2019 | Cheng | H01L 29/1037 |
| 2020/0006577 A1* | 1/2020 | Ching | H01L 29/66545 |
| 2020/0052132 A1* | 2/2020 | Ching | H01L 21/0262 |
| 2020/0066712 A1* | 2/2020 | Hafez | H01L 29/66795 |
| 2020/0083222 A1* | 3/2020 | Kim | H01L 29/66545 |
| 2020/0091143 A1* | 3/2020 | Zang | H01L 29/66545 |
| 2020/0091288 A1* | 3/2020 | Lee | B82Y 10/00 |
| 2020/0273755 A1* | 8/2020 | Wu | H01L 21/823475 |

* cited by examiner

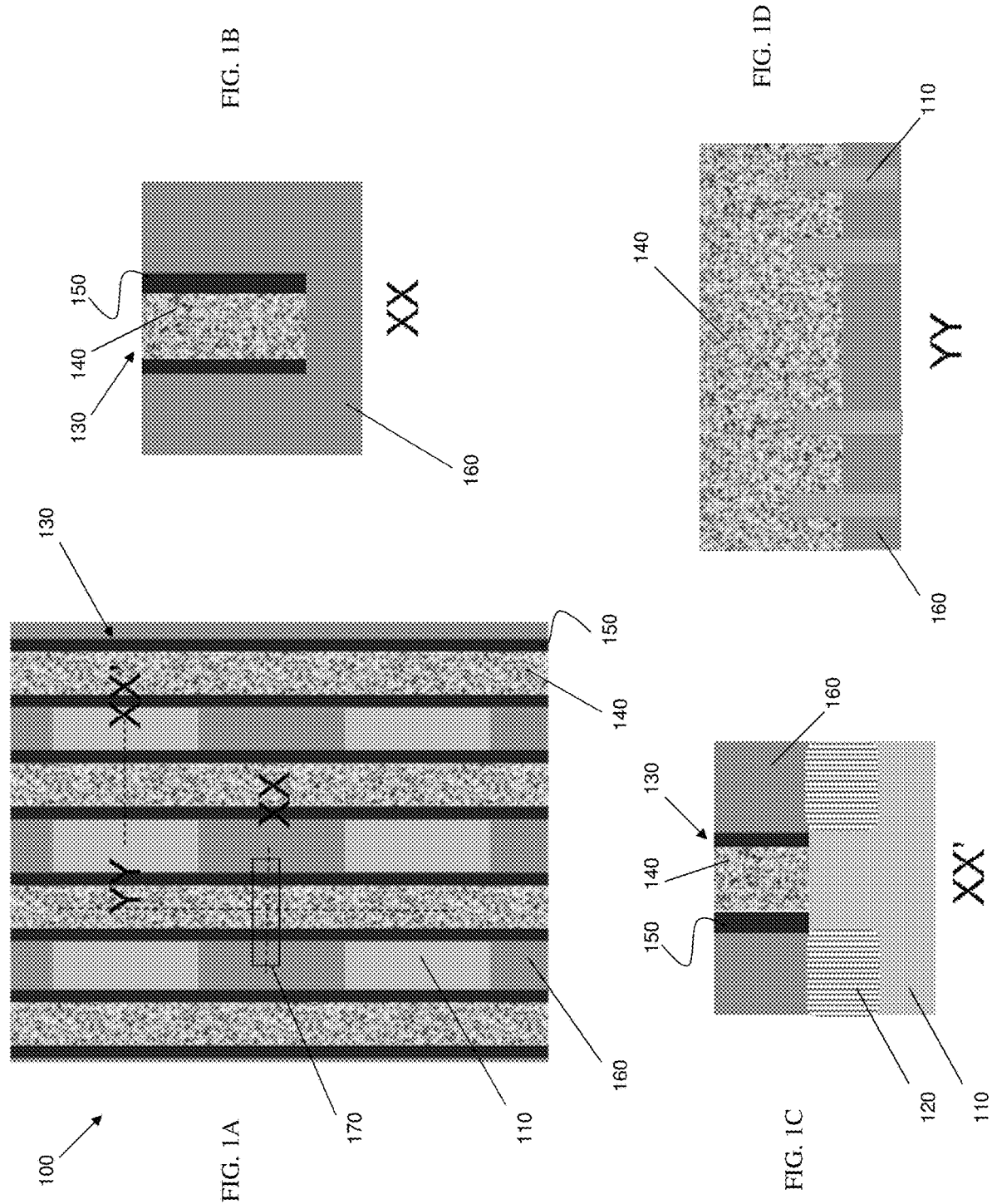

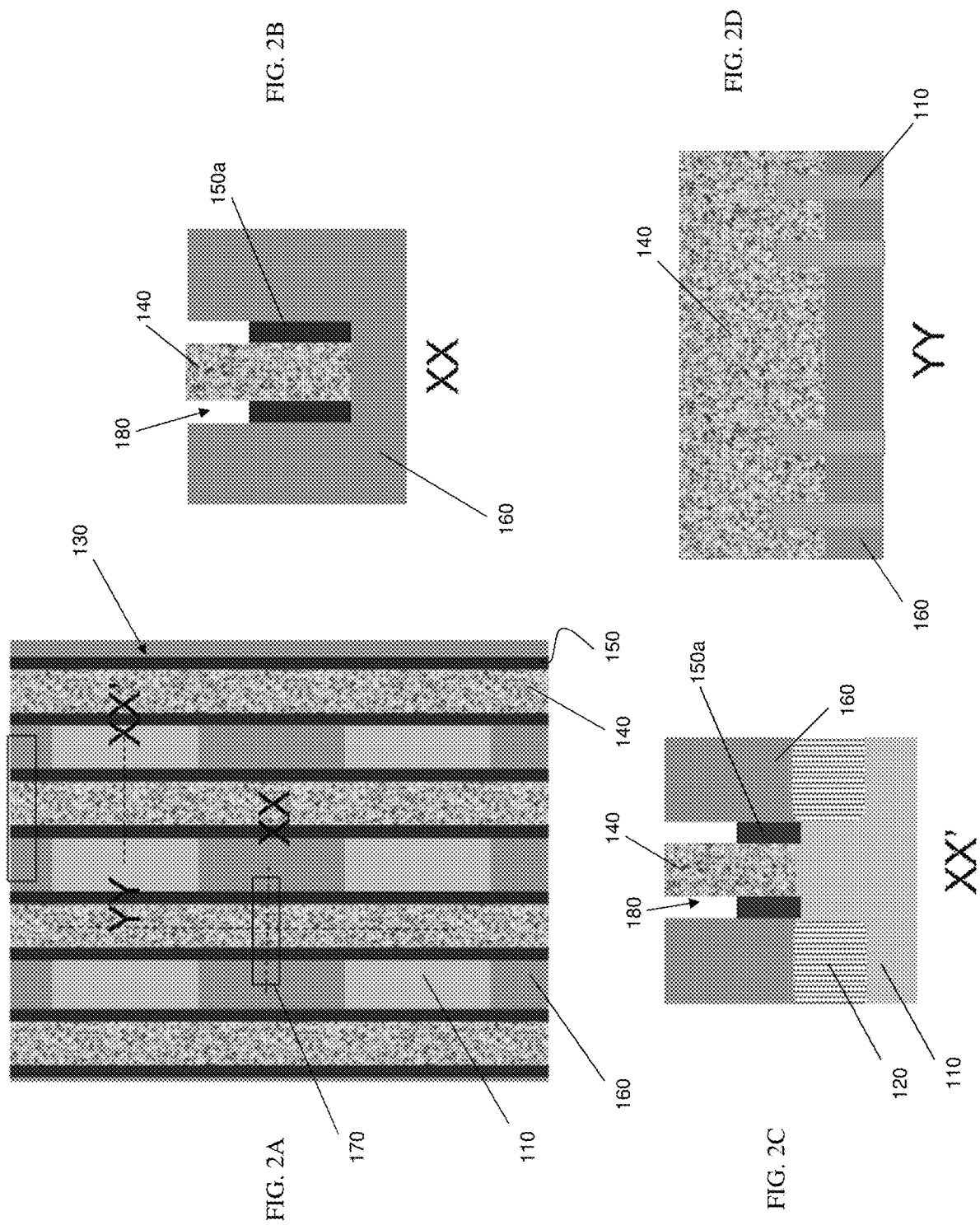

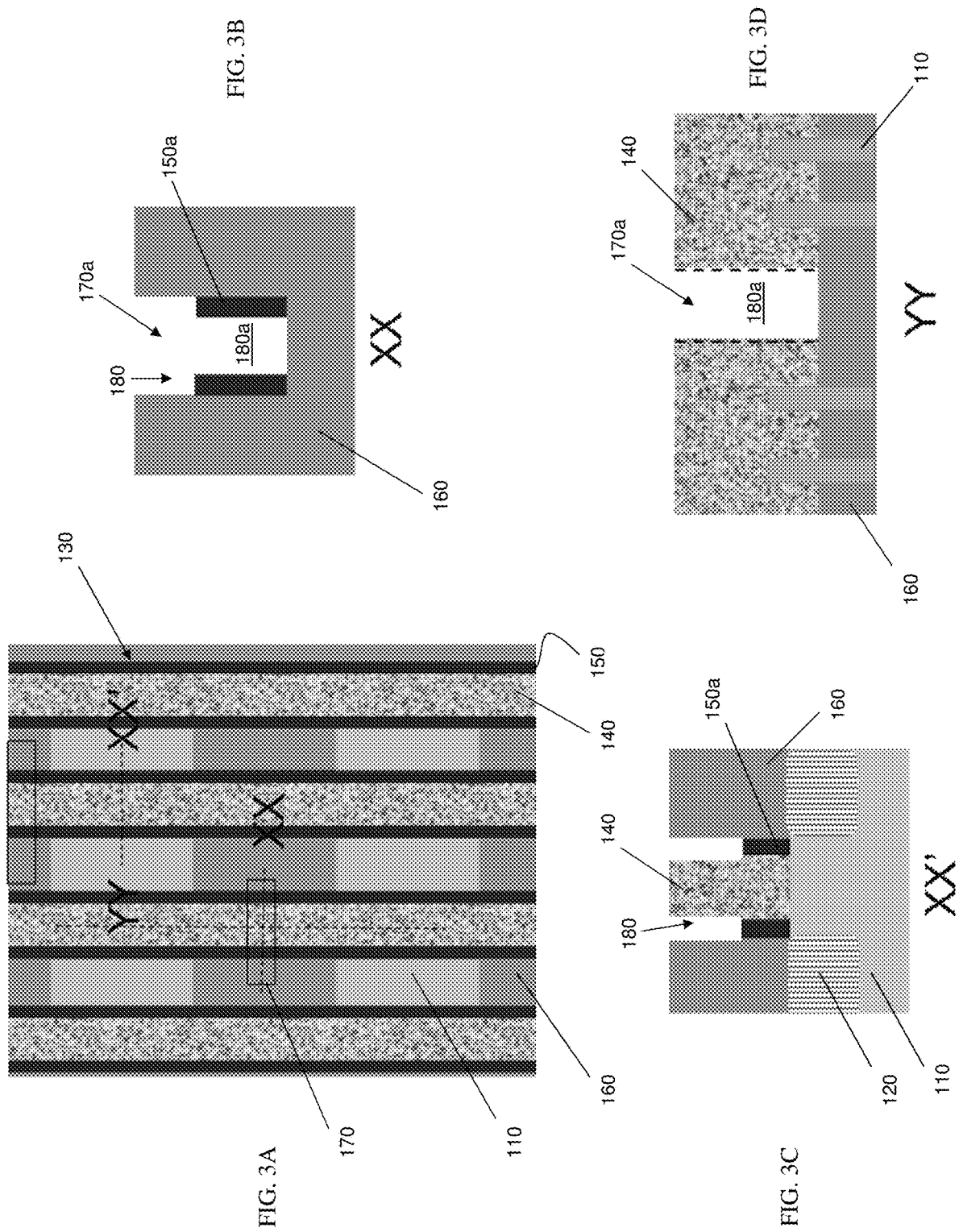

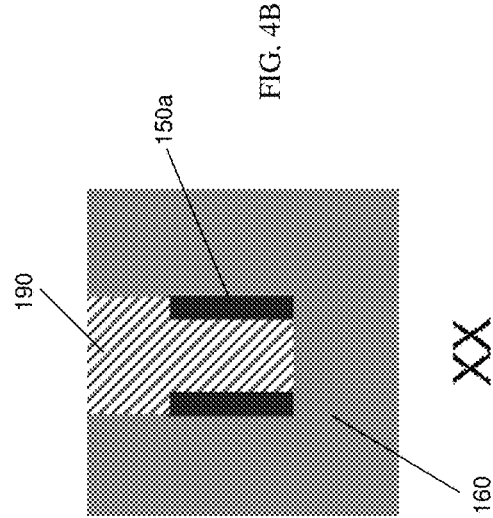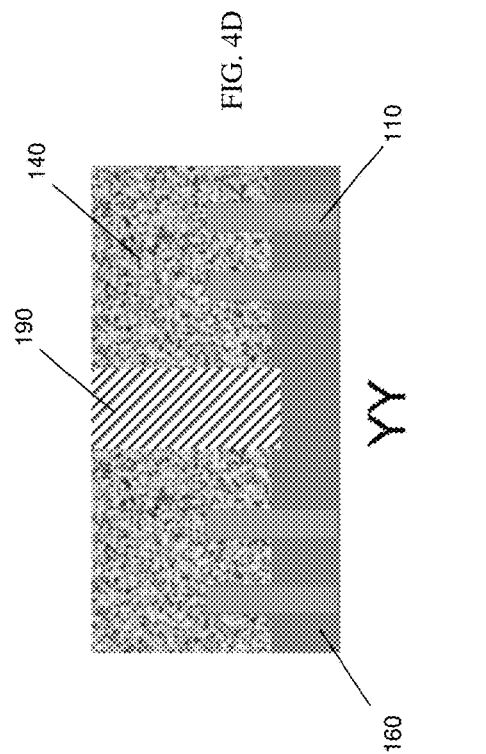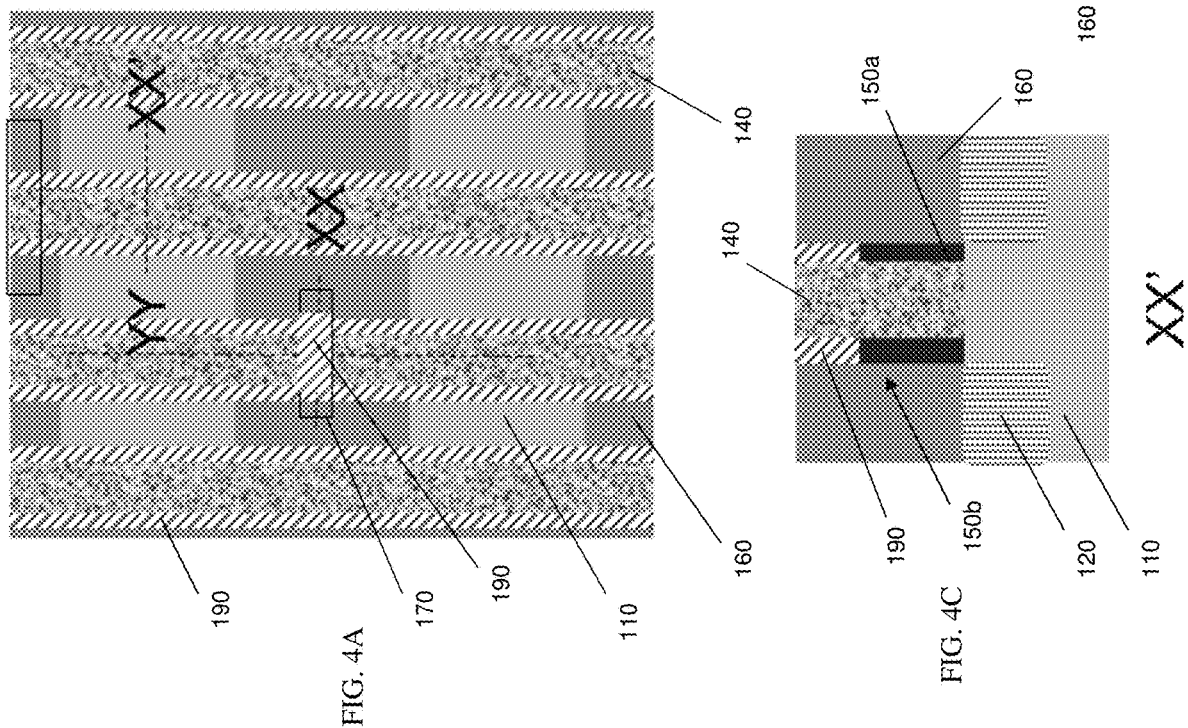

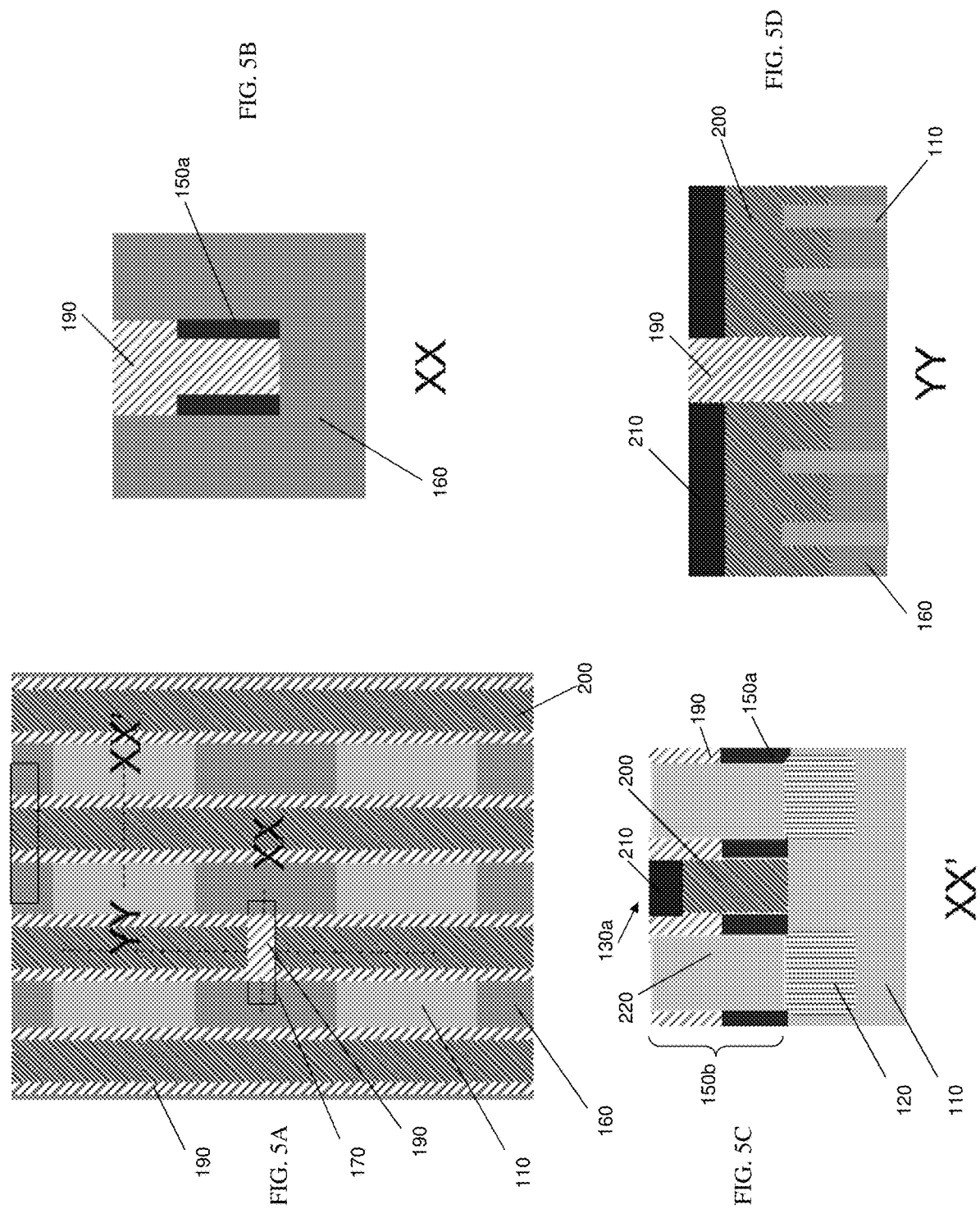

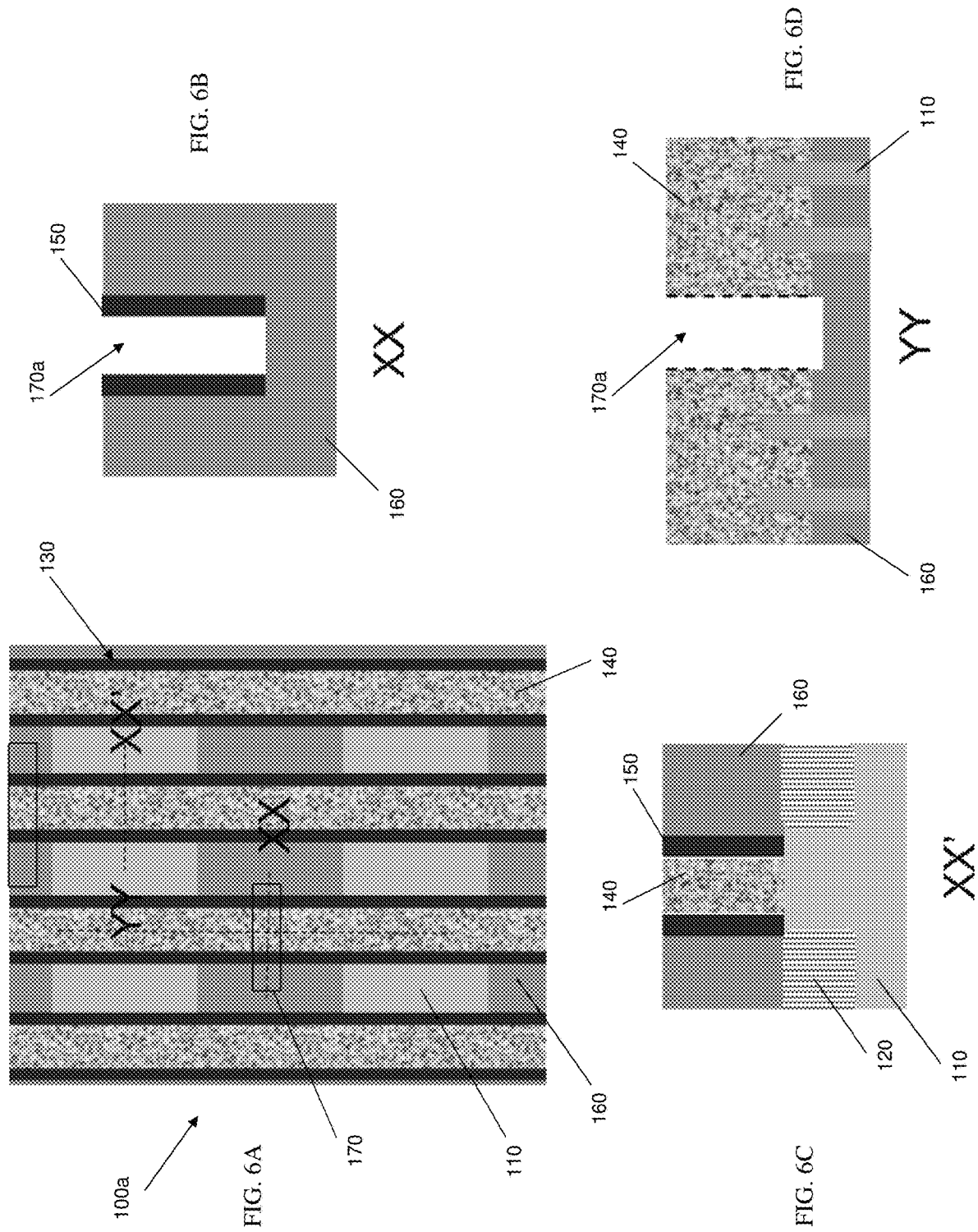

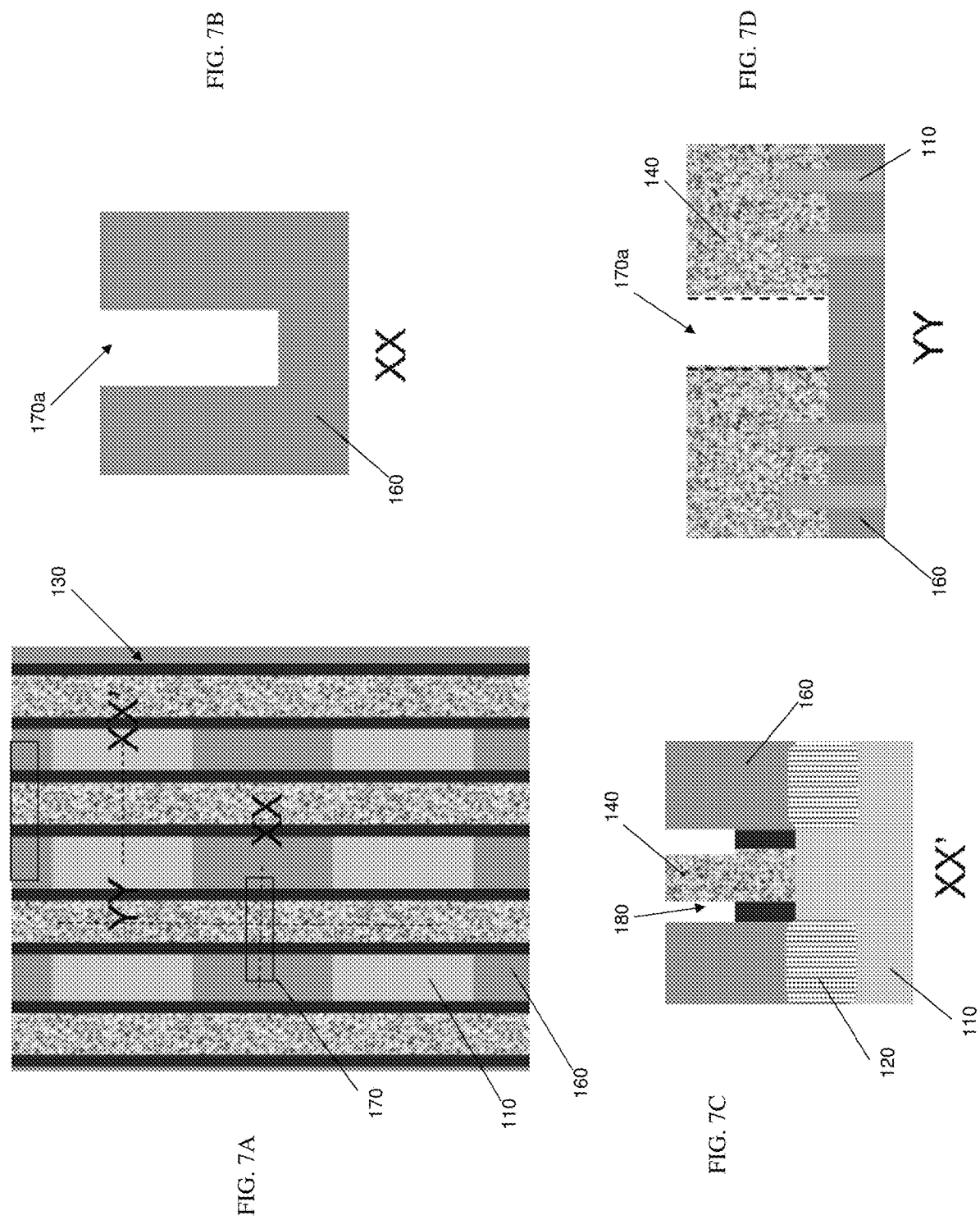

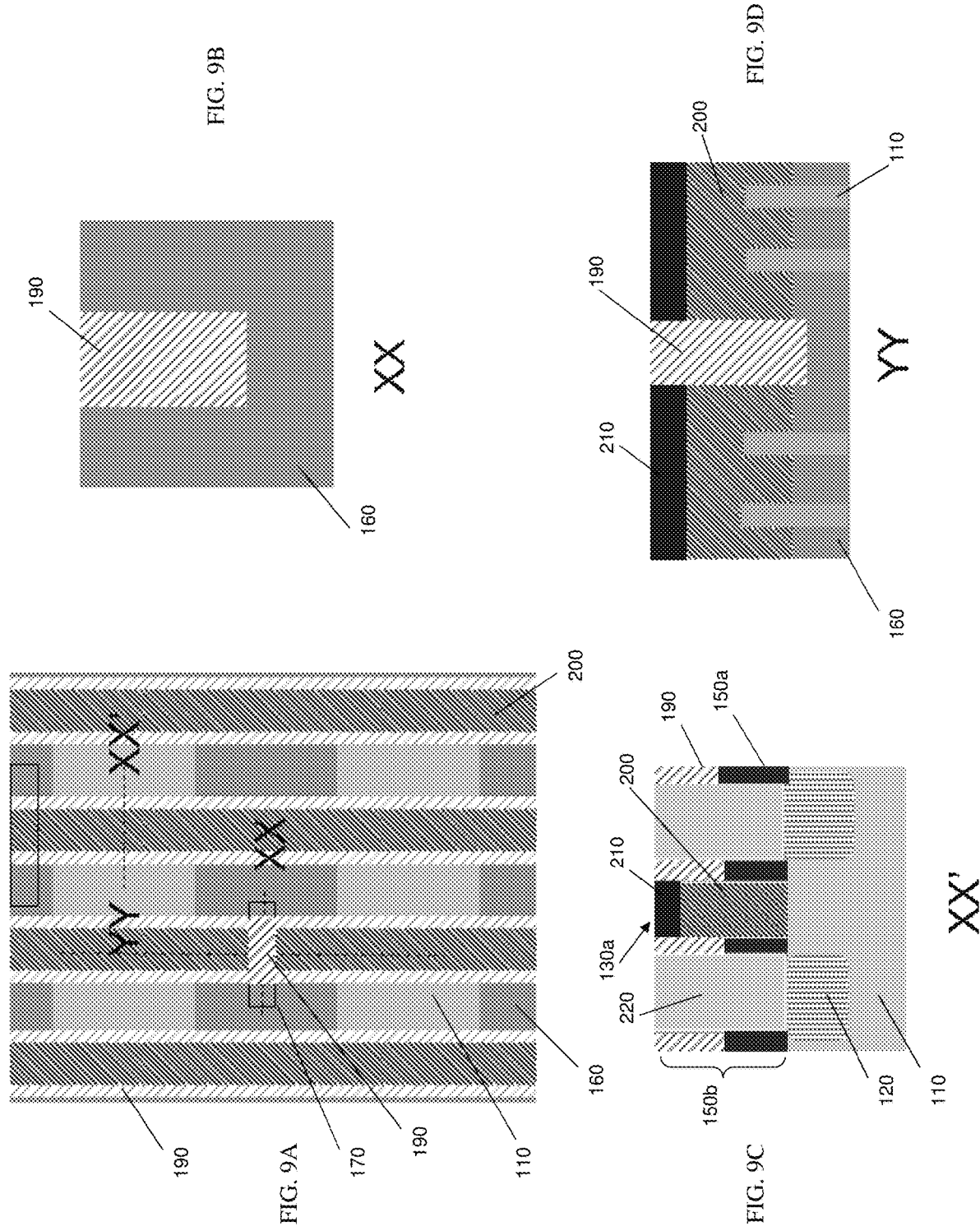

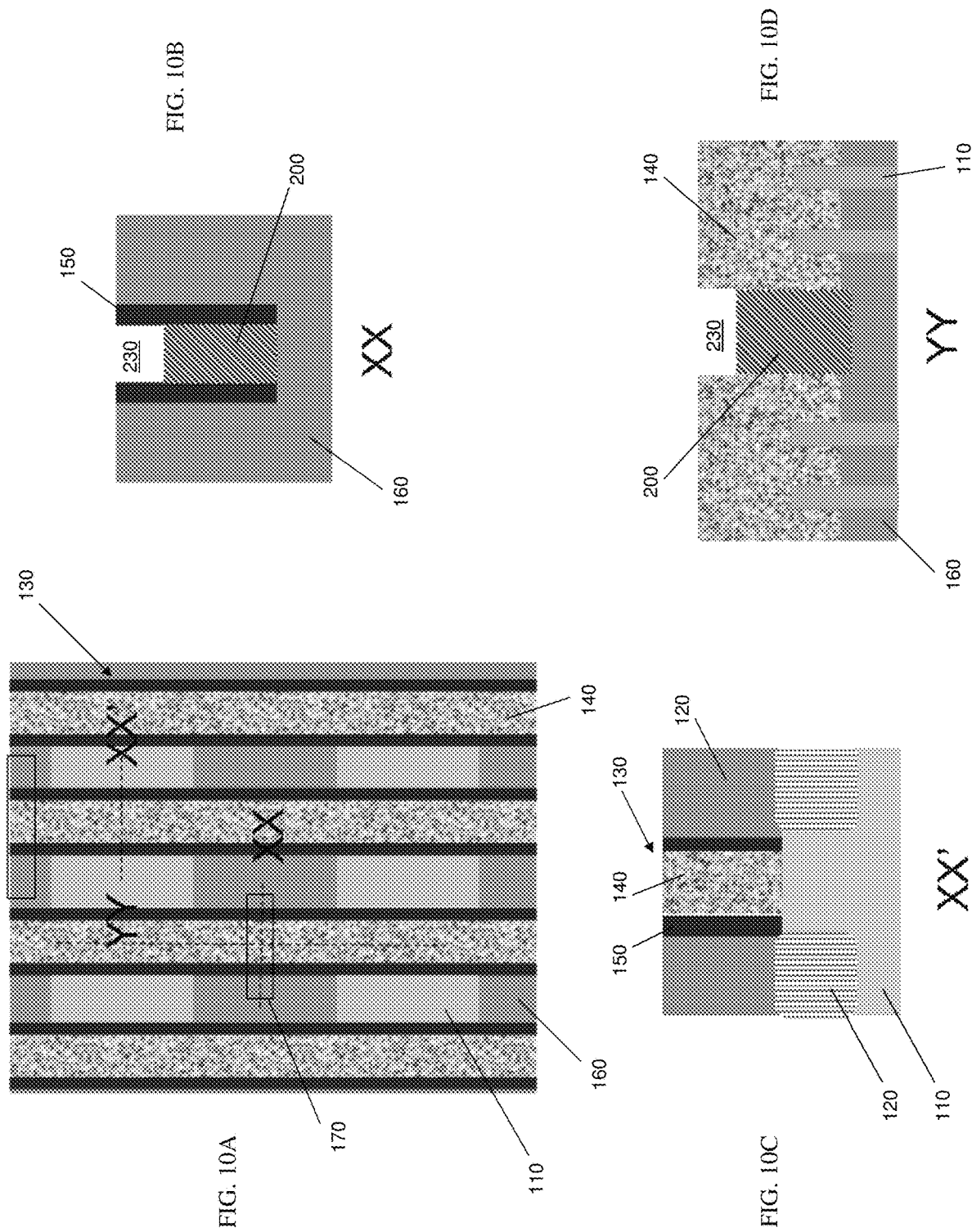

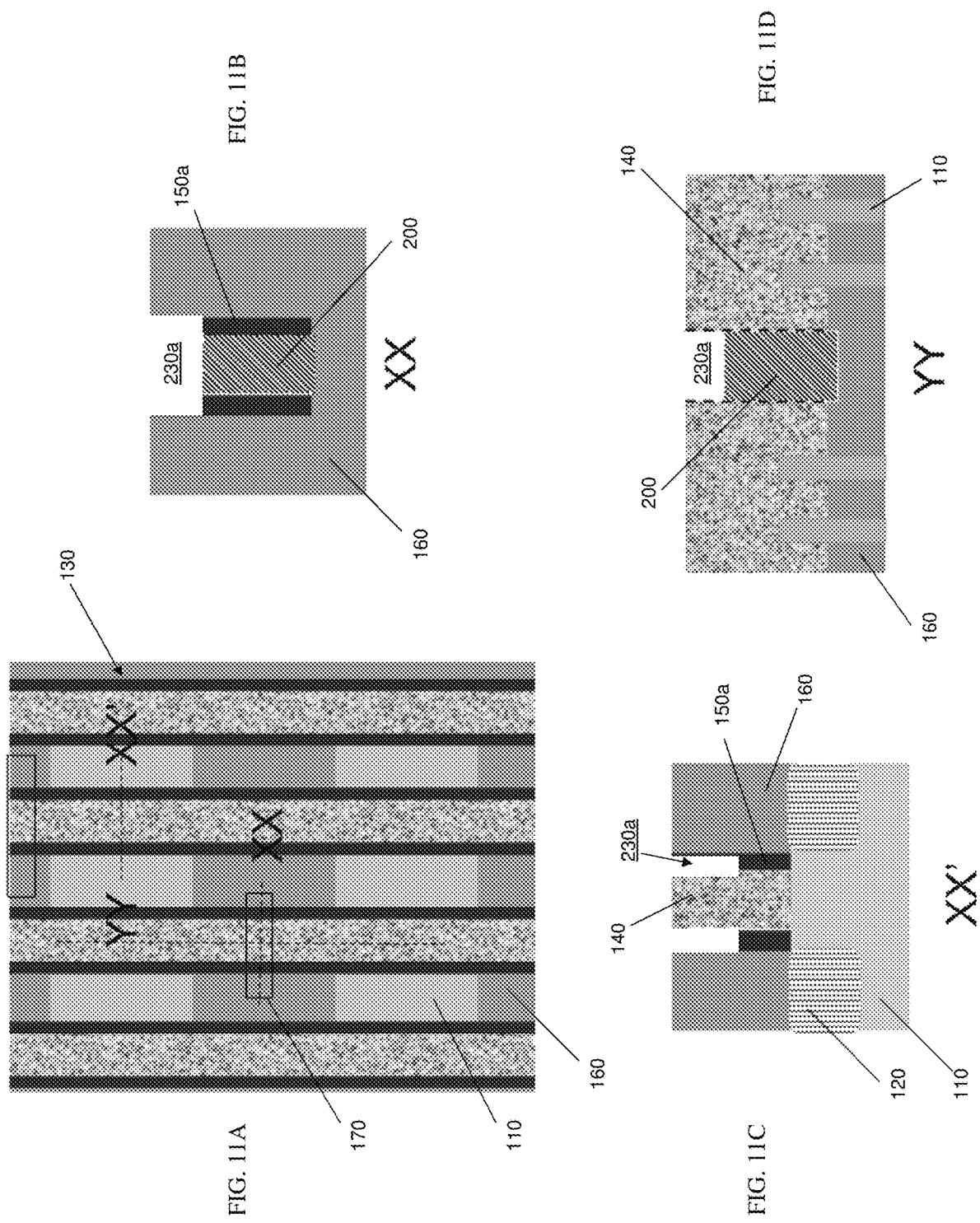

GATE CUT STRUCTURES

FIELD OF THE INVENTION

The present disclosure generally relates to semiconductor structures and, more particularly, to gate cut structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate back end of line (BEOL) and middle of line (MOL) metallization features, e.g., interconnects, due to the critical dimension (CD) scaling and process capabilities, as well as materials that are used to fabricate such structures.

For example, to manufacture interconnect structures for source and drain contacts, it is necessary to remove dielectric material which is adjacent to the gate structures. The removal of the dielectric material is provided by an etching process, which also tends to erode the spacer material of the gate structure. That is, the low-k dielectric material used for the spacer or sidewalls of the gate structure can be eroded away in the downstream etching processes used to form the openings for the source and drain contacts. In this way, the low-k spacers of the gate structure can have erosion issues, causing them to be weak. This will expose the metal material of the gate structure, resulting in a short between the gate structure and a contact to the source and drain regions.

Attempts to address this problem include replacing the low-k dielectric material with a high-k dielectric material for the spacers. However, this approach can cause performance issues for the device. More specifically, using a high-k dielectric will increase the parasitic capacitance of the device. Additionally, removing and replacing the spacers during fabrication process can be very challenging. More specifically, replacing the sidewall spacers may cause alignment issues.

SUMMARY

In an aspect of the disclosure, a structure comprises: a plurality of gate structures comprising source and drain regions and sidewall spacers comprised of different dielectric materials; and contacts connecting to the source and drain regions and isolated from the gate structures by the different dielectric materials.

In an aspect of the disclosure, a structure comprises: a plurality of gate structures comprising source and drain regions and sidewall spacers comprised of a low-k dielectric material and a high-k dielectric material; and contacts connecting to the source and drain regions.

In an aspect of the disclosure, a method comprises: forming a plurality of gate structures comprising source and drain regions and sidewall spacers; pulling down the sidewall spacers to form recessed sidewall spacers; cutting the gate structures to form gate cuts; and depositing a material simultaneously over the recessed sidewall spacers and the gate cuts.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 1A-1D show gate structures, amongst other features, and respective fabrication processes in accordance with aspects of the present disclosure.

FIGS. 2A-2D show recessed spacers, amongst other features, and respective fabrication processes in accordance with aspects of the present disclosure.

FIGS. 3A-3D show the removal of dummy gate materials, amongst other features, and respective fabrication processes in accordance with aspects of the present disclosure.

FIGS. 4A-4D show gate cut structures, amongst other features, and respective fabrication processes in accordance with aspects of the present disclosure.

FIGS. 5A-5D show source and drain contacts, amongst other features, and respective fabrication processes in accordance with aspects of the present disclosure.

FIGS. 6A-9D show alternative structures, amongst other features, and respective fabrication processes in accordance with aspects of the present disclosure.

FIGS. 10A-12D show further alternative structures, amongst other features, and respective fabrication processes in accordance with aspects of the present disclosure.

DETAILED DESCRIPTION

Figure 8B:
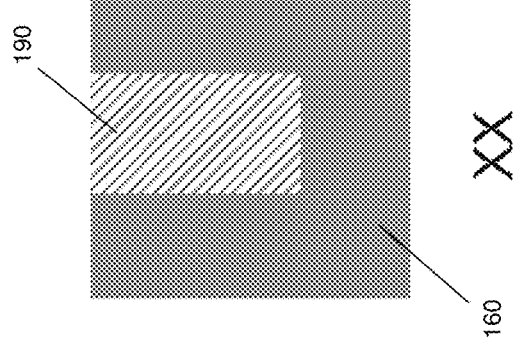

The present disclosure generally relates to semiconductor structures and, more particularly, to gate cut structures and methods of manufacture. In embodiments, the processes and structures described herein provide for more robust sidewall spacers of a gate structure which are comprised of a low-k material. Advantageously, by improving the strength of the low-k sidewall spacers, the metallization features of the gate structures and the source and drain (S/D) regions can be formed without a concern for shorting, while still being able to take advantage of the benefits of implementing a low-k material for the sidewall spacers, e.g., reduced parasitic capacitance, for the device. In this way, the structures and processes described herein allow for structures to be fabricated in advanced technology nodes, i.e., 7 nm and beyond, with a reduced parasitic capacitance.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

FIGS. 1A-1D show an incoming structure and respective fabrication processes in accordance with aspects of the present disclosure. More specifically, FIG. 1A shows a top view of a structure 100, while FIG. 1B shows a cross-sectional view in an XX-axis direction, FIG. 1C shows a cross-sectional view in an XX'-axis direction and FIG. 1D shows a cross-sectional view in a YY-axis direction. The structure 100 comprises fin structures 110 composed of a suitable semiconductor material. For example, the fin structures 110 may be composed of any suitable material including, but not limited to, Si, SiGe, SiGeC, SiC, GaAs, InAs, InP, etc.

In embodiments, the fin structures 110 can be fabricated using a sidewall image transfer (SIT) technique. In an example of a SIT technique, a mandrel material, e.g., $SiO_2$, is deposited on a substrate using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions of the fin structures. Spacers are formed on the sidewalls of the mandrels which are preferably material that is different than the mandrels, and which are formed using conventional deposition processes known to those of skill in the art. The spacers can have a width which matches the dimensions of the fin structures 110, for example. The mandrels are removed or stripped using a conventional etching process, selective to the mandrel material. An etching is then performed within the spacing of the spacers to form the sub-lithographic features. The sidewall spacers can then be stripped.

Dummy gate structures 130 are formed over the fin structures 110. In embodiments, the gate fabrication process of the dummy gate structures 130 begins with dummy gate materials 140, e.g., poly-silicon (poly-Si), to form the dummy gate structures 130. Source and drain (S/D) regions 120 are formed on the sides of the dummy gate structures 130 in the substrate of the fin structures 110 using, e.g., any conventional method. For example, the S/D regions 120 can be formed by an ion implantation process, doping process or through a diffusion processes, as is well known to those of skill in the art such that no further explanation is required for an understanding of the present disclosure. In further embodiments, the S/D regions 120 can be raised S/D regions 120 formed by an epi growth on the surfaces of the substrate, between the dummy gate structures 130.

Sidewall spacers 150, e.g., a low-k dielectric, can be deposited on the sidewalls of the dummy gate materials 140. The sidewall spacers 150 can be deposited by conventional CVD processes followed by a patterning process, e.g., anisotropic etching process, to remove any material from horizontal surfaces of the sidewall spacers 150. A dielectric layer 160 is deposited between the fin structures 110. In embodiments, the dielectric layer 160 is deposited within trenches between the fin structures 110 by chemical vapor deposition (CVD) processes and can be composed of oxide, for example. The deposition of the dielectric layer 160 is followed by a chemical mechanical planarization (CMP) process.

FIG. 1A further shows a cut region 170, which represents a region of the dummy gate structures 130, including the dummy gate materials 140 and the sidewall spacers 150, which will be cut. The structures and processes described herein can allow for the removal of gate materials and sidewall spacer materials at the same time.

FIGS. 2A-2D show recessed sidewall spacers 150a in accordance with aspects of the present invention. In embodiments, the sidewall spacers 150 are etched using a reactive ion etching (RIE) with chemistries that are selective to the low-k material of the sidewall spacers 150, thereby forming the recesses or trenches 180 over the recessed sidewall spacers 150a. In embodiments, the etching is a maskless process which selectively etches the low-k material of the sidewall spacers 150. In embodiments, the trenches 180 can have a depth in a range of 10 nm-100 nm, with a desired depth in a range of 50 nm-60 nm. In this way, the low-k dielectric material, i.e., the low-k dielectric material of the recessed sidewall spacers 150a, has a height in a range of 50 to 60 nm. More specifically, the trenches 180 can have a depth so that the recessed sidewall spacers 150a have a height in a range of 30 nm-40 nm from a top surface of the fin structures 110. Further, the deposition of a high-k dielectric material, i.e., dielectric material 190, within the trenches 180, results in the high-k dielectric material, i.e., dielectric material 190, having a height in a range of about 30 nm to 40 nm. More specifically, the high-k dielectric material, i.e., dielectric material 190, has a height in a range of 10 nm-100 nm.

In FIGS. 3A-3D, trenches 180a are formed by selective removal of the dummy gate materials 140. More specifically, the trenches 180a are formed by the removal of the dummy gate materials 140 using conventional etching techniques, e.g., RIE process. For example, an etching process with a selective chemistry with respect to the low-k dielectric material of the recessed sidewall spacers 150a, e.g., RIE, will be used to form one or more trenches 180a in the dummy gate materials 140, thereby forming the gate cut 170a.

FIGS. 4A-4D show the deposition of a dielectric material 190 within the trenches 180, 180a and over the recessed sidewalls spacers 150a to form the sidewall spacers 150b. In embodiments, the dielectric material 190 can be deposited by CVD processes, followed by a CMP process. The dielectric material 190 can be comprised of any suitable dielectric material, e.g., SiCO, SiN, amongst other examples. More specifically, the dielectric material 190 can be comprised of a high-k dielectric material. In this way, the high-k dielectric material is over the low-k dielectric material. The implementation of the dielectric material 190 allows for more robust sidewall spacers, i.e., recessed sidewall spacers 150a together with dielectric material 190 which form the sidewall spacers 150b, than a low-k dielectric material only. This allows for the alleviation of any concerns of shorting between the metallization features of gate structures and S/D regions. Further, the structures and processes described herein allow for the advantages of a low-k material, e.g., reduced parasitic capacitance, to be used without a concern for shorting in middle of line (MOL) structures. More specifically, the structures and processes described herein allow for the gate cut 170a and the recessed sidewall spacers 150a to be covered by the dielectric material 190 simultaneously, which provides the advantage of reduced processing steps.

FIGS. 5A-5D show recessed gate structures 130a and S/D contacts 220 in accordance with aspects of the present invention. In embodiments, the dummy gate materials 140, e.g., poly-Si, are completely stripped away using conventional etching processes selective to the dummy gate materials 140, thereby forming trenches. The recessed gate structures 130a are formed within the trenches and include gate dielectric materials and metallization features. The gate dielectric materials can be, e.g., a high-k gate dielectric material, e.g., hafnium based dielectrics. In further embodiments, the high-k dielectric materials can include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. In this way, the plurality of gate structures are recessed gate structures 130a.

The gate cute 170a results in the plurality of gate structures, i.e., recessed gate structures 130a, as being separated along a longitudinal direction by a gate cut 170a. In embodiments, the gate cut 170a is filled with a high-k dielectric material, i.e., the dielectric material 190. In this way, the structures and processes described herein provide for a plurality of gate structures, i.e., recessed gate structures 130a, comprising source and drain regions 120 and sidewall spacers comprised of a low-k dielectric material and a high-k dielectric material, i.e., sidewall spacers 150b. Additionally, contacts, i.e., S/D contacts 220, connect to the source and drain regions 120.

The metallization features, i.e., the gate material 200, can include any workfunction metal or any combination of metals, depending on the particular application and design parameters. For example, in embodiments, the gate material 200 can be a tungsten (W) material, amongst other examples. In this way, the structures and processes described herein provide for a plurality of gate structures, i.e., recessed gate structures 130a, comprising source and drain regions 120 and sidewall spacers 150b, comprised of different dielectric materials, i.e., the low-k dielectric material of the recessed sidewall spacers 150a and the dielectric material 190 over the recessed sidewall spacers 150a. In this way, the different dielectric materials are a high-k dielectric material, i.e., dielectric material 190, and a low-k dielectric material, the low-k dielectric of the spacers 150, 150a. Further, the structures and processes described herein provide for contacts, i.e., S/D contacts 220, connecting to the source and drain regions 120 and isolated from the gate structures, i.e., recessed gate structures 130a, by the different dielectric materials, the low-k dielectric material of the recessed sidewall spacers 150a and the dielectric material 190 over the recessed sidewall spacers 150a which form the sidewall spacers 150b.

In embodiments, the gate material 200 is etched to form the recessed gate structures 130a. The gate material 200 can be etched using selective etching processes to the gate material 200, e.g., a wet etch process. A capping material 210 is deposited within the recesses over the gate material 200, e.g., using a CVD process followed by a CMP process. The capping material 210 can be any suitable capping material, e.g., SiN, amongst other examples. In this way, there is a dielectric cap, i.e., capping material 210, over the gate structures, i.e., recessed gate structures 130a.

FIG. 5C shows the formation of S/D contacts 220. In embodiments, trenches are formed in the dielectric layer 160 which expose the S/D regions 120 using conventional lithography and etching techniques, e.g., RIE process. For example, a resist formed over the dielectric layer 160 is exposed to energy (light) to form a pattern (opening). An etching process with a selective chemistry, e.g., RIE, will be used to form one or more trenches in the dielectric layer 160 through the openings of the resist. The resist can then be removed by a conventional oxygen ashing process or other known stripants.

A silicide liner is deposited in the trenches over the S/D regions 120 and then subjected to a silicide process, i.e., an anneal process. The silicide liner can be deposited using physical vapor deposition (PVD) or CVD processes. In embodiments, the silicide liner can be Ti, Ni, NiPt and Co, amongst other examples. Following the silicide process, a metal material is deposited on the silicide liner, thereby forming the S/D contacts 220. In this way, the contacts, i.e., S/D contacts 220, connecting to the source and drain regions 120, are trench silicide structures. In embodiments, the metal material can be composed of cobalt (Co) or tungsten (W) or Ruthenium (Ru), for example. In further embodiments, there could be a thin metal liner material deposited before deposition metal of the metal material, e.g. TiN, TaN. The deposition of the metal material is followed by a CMP polishing process down to the dielectric material 190. In this way, the S/D contacts 220 are over the source and drain regions 120.

The processes and structures described herein provide for more robust sidewall spacers of a gate structure which are comprised of a low-k material. More specifically, the sidewall spacers 150, 150a are strengthened by having a top portion of the sidewall spacers 150, 150a covered by the dielectric material 190, thereby forming the sidewall spacers 150b. Advantageously, by improving the strength of the low-k sidewall spacers 150, 150a, the metallization features of the recessed gate structures 130a, i.e., gate material 200, and the metallization features of the source and drain (S/D) regions 120, i.e., S/D contacts 220, can be formed without a concern for shorting because of the robustness of the dielectric material 190 over the recessed sidewall spacers 150a.

Accordingly, the structures and processes described herein allow for structures to be fabricated in advanced technology nodes, i.e., 7 nm and beyond, with a reduced parasitic capacitance by implementing a low-k dielectric as a material for the sidewall spacers 150, 150a of the recessed gate structures 130a. More specifically, the processes described herein provide for a method with the steps of forming a plurality of gate structures, i.e., recessed gate structures 130a, comprising source and drain regions 120 and sidewall spacers 150, pulling down the sidewall spacers 150 to form recessed sidewall spacers 150a, cutting the gate structures, i.e., recessed gate structures 130a, to form gate cuts 170a, and depositing a material, i.e., dielectric material 190, simultaneously over the recessed sidewall spacers 150a and the gate cuts 170a. In embodiments, the cutting of the gate structures, i.e., recessed gate structures 130a, occurs prior to the pulling down of the sidewall spacers 150. In further embodiments, the cutting of the gate structures, i.e., recessed gate structures 130a, occurs after the pulling down of the sidewall spacers 150. Additionally, this deposition of the material, i.e., dielectric material 190, simultaneously forms a spacer top gap fill over the recessed sidewall spacers 150.

FIGS. 6A-6D show alternative structures and processes in accordance with aspects of the present invention. Similar to the structures and processes described in FIGS. 1A-5D, the structure 100a includes a dielectric layer 160 formed between the fin structures 110, and dummy gate structures 130 formed between the fin structures 110 and the dielectric layer 160. The dummy gate structures comprise dummy gate materials 140, with S/D regions 120 being formed on the sides of the dummy gate structures 130. However, the structures and processes of FIGS. 6A-6D begin with the gate cut 170a as opposed to the structures and processes of FIGS. 1A-5D in which the gate cut 170a occurs later in the process.

In embodiments, the gate cut 170a are formed in the dummy gate materials 140 using conventional lithography and etching techniques, e.g., RIE process. For example, a photoresist is formed over the dielectric layer 160 and the dummy gate materials 140. The photoresist is exposed to energy (light) to form a pattern (opening). An etching process with a selective chemistry with respect to the low-k dielectric material of the sidewall spacers 150, e.g., RIE, will be used to form one or more trenches in the dummy gate materials 140 through the openings of the resist, thereby forming the gate cut 170a. The resist can then be removed by a conventional oxygen ashing process or other known stripants.

FIGS. 7A-7D show the partial removal of the sidewall spacers 150 on the sidewalls of the trench 180 of the dielectric layer 160, thereby leaving trenches 180. More specifically, FIG. 7B shows the complete removal of the sidewall spacers 150. In embodiments, the sidewall spacers 150 are etched using a RIE process with chemistries that are selective to the low-k material of the sidewall spacers 150, thereby forming the trenches 180. Further, FIG. 7C shows recessing of the low-k dielectric of the sidewall spacers 150.

Figure 8D:
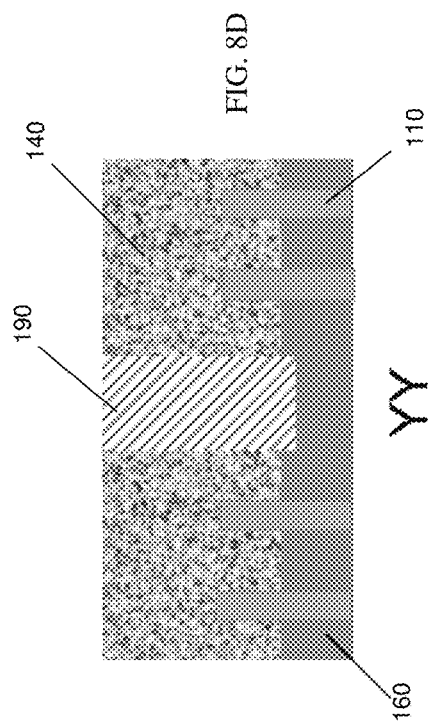
Figure 8A:
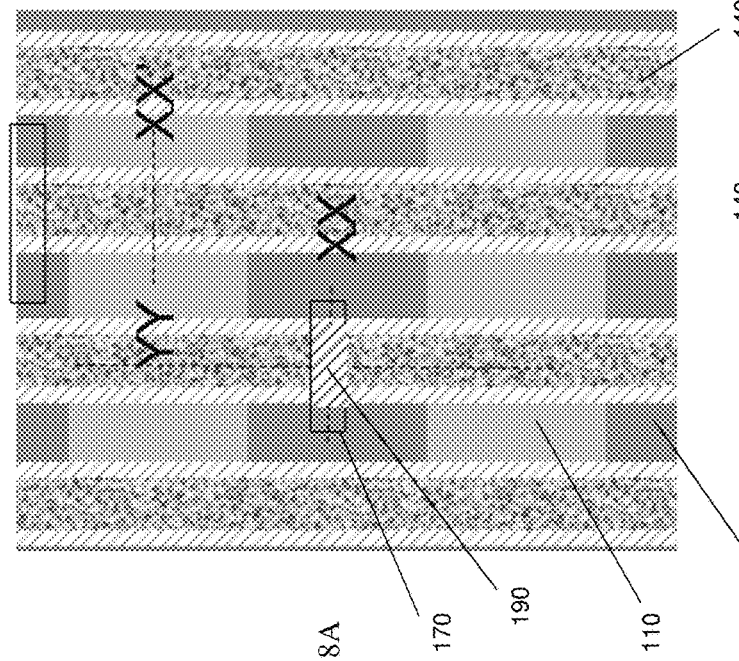
Figure 8C:
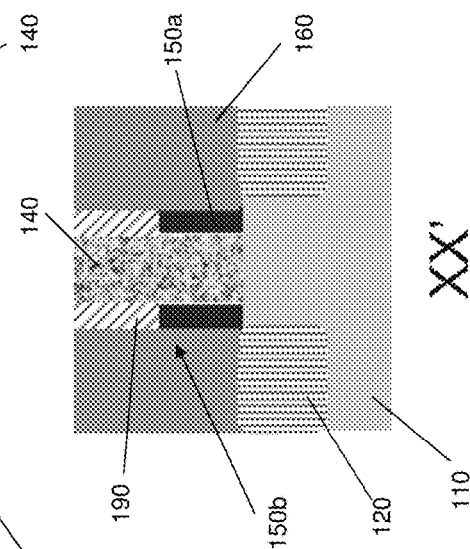

FIGS. 8A-8D show the deposition of a dielectric material 190, which occurs simultaneously over the gate cut and the recessed sidewall spacers 150a, which results in the formation of sidewall spacers 150b. In embodiments, the dielectric material 190, which is comprised of e.g., SiCO, SiN, is deposited by CVD processes, followed by a CMP process. The implementation of the dielectric material 190 allows for more robust sidewall spacers, i.e., recessed sidewall spacers 150a together with dielectric material 190, than a low-k dielectric material only. This allows for the alleviation of any shorting concerns between the metallization features of gate structures, i.e., recessed gate structures, and S/D regions 120.

FIGS. 9A-9D show the formation of the recessed gate structures 130a and S/D contacts 220. Similar to the structures and processes of FIGS. 1A-5D, the dummy gate materials 140, e.g., poly-Si, are stripped away using conventional etching processes selective to the dummy gate materials 140, thereby forming trenches. The recessed gate structures 130a are formed within the trenches and include gate dielectric materials, e.g., a high-k gate dielectric material, and metallization features, i.e., the gate material 200, which includes any workfunction metal or any combination of metals, depending on the particular application and design parameters. As shown in FIG. 9C, the gate material 200 is etched to form recesses, and a capping material 210 is deposited within the recesses over the gate material 200, e.g., using a CVD process followed by a CMP process.

The capping material 210 can be any suitable capping material, e.g., SiN, amongst other examples. S/D contacts 220 are formed by using conventional lithography and etching techniques, e.g., RIE process, to etch trenches the dielectric layer 160, thereby exposing the S/D regions 120. A silicide liner is deposited in the trenches over the S/D regions 120 and then subjected to a silicide process. Following the silicide process, a metal material is deposited on the silicide liner, thereby forming the S/D contacts 220. In this way, the contacts of the source and drain regions 120, i.e., S/D contacts 220, comprise a liner and a fill material, i.e., the metal material. The dielectric material 190 allows for the prevention of shorting between the metallization features, i.e., gate material 200, of the recessed gate structures 130a and the metallization features, i.e., S/D contacts 220, of the S/D regions 120.

Figure 12B:
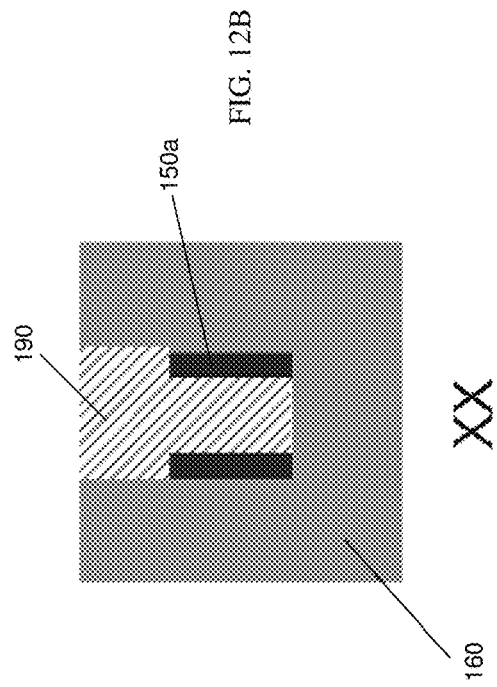
Figure 12A:
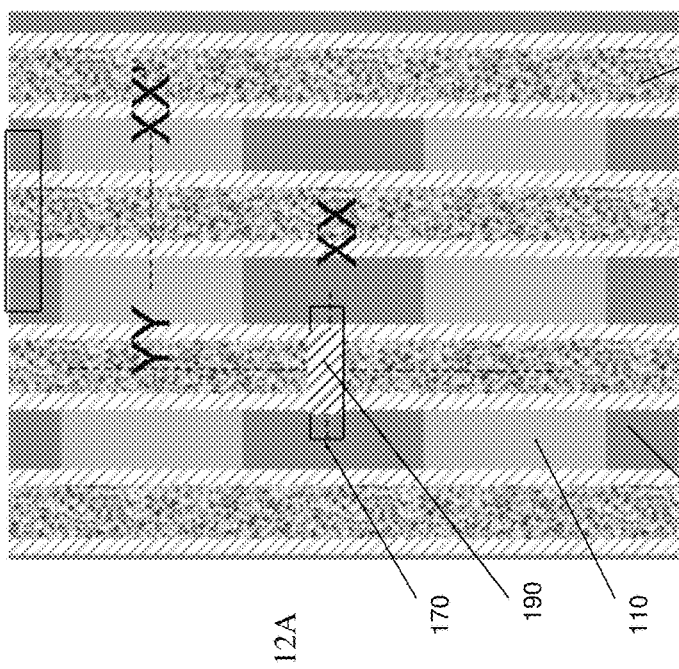
Figure 12D:
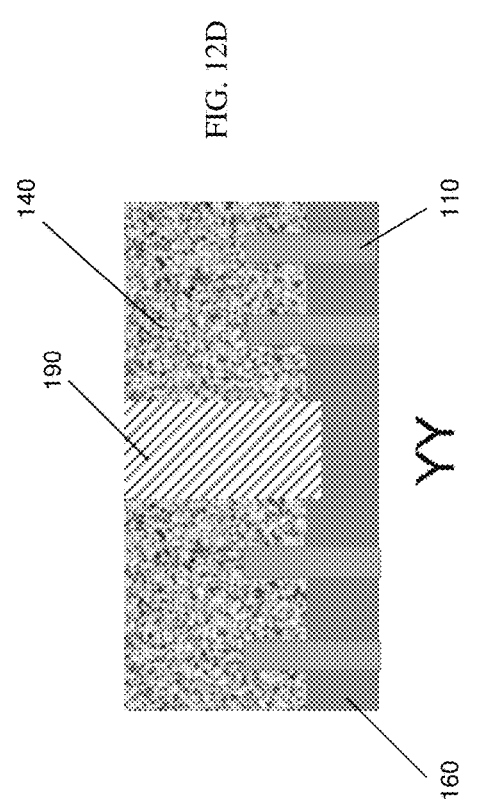
Figure 12C:
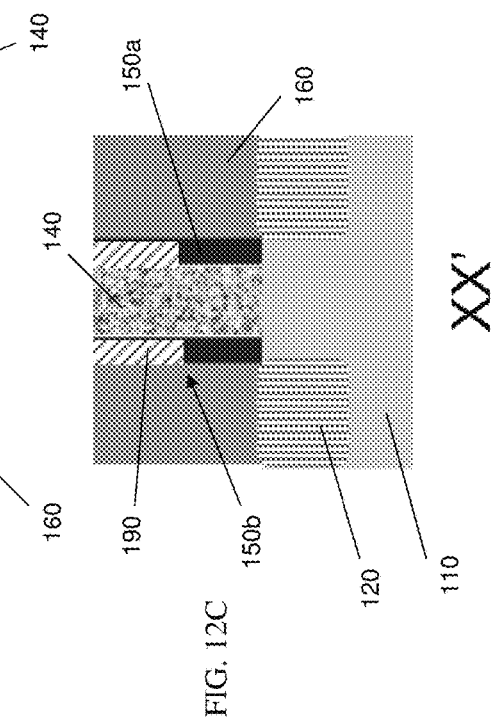

FIGS. 10A-12D show alternative structures in accordance with aspects of the present invention. In contrast to the processes described in FIGS. 1A-9D, FIGS. 10A-10D begin with the recessed gate structures 130a, comprising the gate material 200 and the S/D regions 120. In embodiments, the gate material 200 is etched to form recesses 230 in the recessed gate structures 130a. The gate material 200 can be etched using selective etching processes to the gate material 200, e.g., a wet etch process.

FIGS. 11A-11D show further etching of the sidewall spacers 150, thereby forming the trench 230a. More specifically, the sidewall spacers 150 are etched using a RIE process with chemistries that are selective to the low-k material of the sidewall spacers 150, thereby forming the trenches 230a over the recessed sidewall spacers 150a. FIGS. 12A-12D show the deposition of a dielectric material 190, which occurs simultaneously over the gate cut 170a and the recessed sidewall spacers 150a. The implementation of the dielectric material 190 allows for more robust sidewall spacers, i.e., recessed sidewall spacers 150a together with dielectric material 190 which form the sidewall spacers 150b, than a low-k dielectric material only. This allows for the alleviation of any shorting concerns between the metallization features, i.e., gate material 200, of the recessed gate structures 130a and the metallization features, i.e., S/D contacts 220, of the S/D regions 120.

It should now be understood that the processes and resultant structures described herein will serve to further protect the gate material of the gate structure during MOL processes. The resultant structures, e.g., strengthened sidewall spacers, will hence prevent shorts occurring from occurring with interconnect or other wiring structures of the source/drain regions. Accordingly, the processes and structures described herein will increase yield. More specifically, the processes and structures described herein provide for more robust sidewall spacers of a gate structure which are comprised of a low-k material, than a low-k material by itself. Advantageously, by improving the strength of the low-k sidewall spacers, the metallization features of the gate structures and the metallization features of the source and drain (S/D) regions can be formed without a concern for shorting because of the robustness of the dielectric material. In this way, the structures and processes described herein allow for structures to be fabricated in advanced technology nodes, i.e., 7 nm and beyond, with a reduced parasitic capacitance by implementing a low-k dielectric as a material for the sidewall spacers of the gate structures.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure, comprising:
a plurality of gate structures each comprising gate material, source and drain regions, a first sidewall spacer located on a lower sidewall portion of the gate material, and a second sidewall spacer located on an upper sidewall portion of the gate material, the first and second sidewall spacers being comprised of different dielectric materials from one another, the second sidewall spacer being stacked on a top surface of the first sidewall spacer such that the lower sidewall portion of the gate material is devoid of the second sidewall spacer, and the upper sidewall portion of the gate material is devoid of the first sidewall spacer; and contacts connecting to the source and drain regions and isolated from the gate structures by the different dielectric materials.

2. The structure of claim 1, wherein the contacts of the source and drain regions comprise a liner and a fill material.

3. The structure of claim 2, wherein the different dielectric materials are a high-k dielectric material and a low-k dielectric material.

4. The structure of claim 3, wherein the high-k dielectric material has a height in a range of about 30 nm to 40 nm.

5. The structure of claim 4, wherein the low-k dielectric material has a height in a range of 50 to 60 nm.

6. The structure of claim 5, wherein the first sidewall spacer is comprised of the low-k dielectric material and the second sidewall spacer is comprised of the high-k dielectric material.

7. The structure of claim 1, wherein the plurality of gate structures are recessed gate structures.

8. The structure of claim 7, wherein the plurality of gate structures are separated along a longitudinal direction by a gate cut.

9. The structure of claim 8, wherein the gate cut is filled with the high-k dielectric material.

10. The structure of claim 1, further comprising a dielectric cap over the gate structures.

11. The structure of claim 1, wherein the contacts connecting to the source and drain regions are trench silicide structures.

12. A structure, comprising:

a plurality of gate structures each comprising gate material, source and drain regions, a first sidewall spacer located on a lower sidewall portion of the gate material, and a second sidewall spacer located on an upper sidewall portion of the gate material, the first and second sidewall spacers being comprised of different dielectric materials from one another, the second sidewall spacer being stacked on a top surface of the first sidewall spacer such that the lower sidewall portion of the gate material is devoid of the second sidewall spacer, and the upper sidewall portion of the gate material is devoid of the first sidewall spacer; and contacts connecting to the source and drain regions and isolated from the gate structures by the different dielectric materials wherein the plurality of gate structures are separated along a longitudinal direction by a gate cut.

13. The structure of claim 12, wherein the plurality of gate structures are recessed gate structures.

14. The structure of claim 12, wherein the gate cut is filled with the high-k dielectric material, and the contacts of the source and drain regions comprise a liner and a fill material.

15. The structure of claim 14, wherein the different dielectric materials are a high-k dielectric material and a low-k dielectric material.

16. The structure of claim 15, wherein the high-k dielectric material has a height in a range of about 30 nm to 40 nm.

17. The structure of claim 16, wherein the low-k dielectric material has a height in a range of 50 to 60 nm.

18. The structure of claim 17, wherein the high-k dielectric material is over the low-k dielectric material.

19. The structure of claim 12, further comprising a dielectric cap over the gate structures, wherein the contacts connecting to the source and drain regions are trench silicide structures.

20. The structure of claim 12, wherein:

the gate cut is filled with the high-k dielectric material;

the contacts of the source and drain regions comprise a liner and a fill material;

the first sidewall spacer is comprised of low-k dielectric material and the second sidewall spacer is comprised of high-k dielectric material;

the lower sidewall portion of the gate material includes only the first sidewall spacer; and the upper sidewall portion of the gate material includes only the second sidewall spacer.

* * * * *